United States Patent
Yi et al.

(10) Patent No.: US 11,056,495 B2
(45) Date of Patent: Jul. 6, 2021

(54) STRUCTURE OF MEMORY DEVICE HAVING FLOATING GATE WITH PROTRUDING STRUCTURE

(71) Applicant: United Microelectronics Corp., Hsinchu (TW)

(72) Inventors: Liang Yi, Singapore (SG); Zhiguo Li, Singapore (SG); Chi Ren, Singapore (SG); Qiuji Zhao, Singapore (SG); Boon Keat Toh, Singapore (SG)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 16/455,297

(22) Filed: Jun. 27, 2019

(65) Prior Publication Data
US 2020/0395369 A1 Dec. 17, 2020

(30) Foreign Application Priority Data

Jun. 13, 2019 (CN) .......................... 201910510488.5

(51) Int. Cl.
| | | |
|---|---|---|
| *H01L 27/11521* | (2017.01) | |
| *H01L 29/788* | (2006.01) | |
| *H01L 29/51* | (2006.01) | |
| *H01L 29/423* | (2006.01) | |

(52) U.S. Cl.
CPC .. *H01L 27/11521* (2013.01); *H01L 29/42328* (2013.01); *H01L 29/513* (2013.01); *H01L 29/518* (2013.01); *H01L 29/788* (2013.01)

(58) Field of Classification Search
CPC ............. H01L 27/11521; H01L 29/513; H01L 29/788; H01L 29/42328; H01L 29/518; H01L 29/41; H01L 29/42344; H01L 29/7883; H01L 29/66825; H01L 29/42324; H01L 2924/1438; H01L 27/115; G11C 11/5635; G11C 16/0408; G11C 16/14

See application file for complete search history.

(56) References Cited

U.S. PATENT DOCUMENTS

| | | | |
|---|---|---|---|
| 5,070,032 A | 12/1991 | Yuan | |
| 5,095,344 A | 3/1992 | Harari | |
| 5,846,861 A | 12/1998 | Saitoh | |
| 6,294,812 B1 * | 9/2001 | Ding | .................... H01L 27/115 257/321 |
| 7,037,787 B2 * | 5/2006 | Fan | .................... G11C 16/0433 438/267 |

(Continued)

*Primary Examiner* — Khiem D Nguyen
(74) *Attorney, Agent, or Firm* — J.C. Patents

(57) ABSTRACT

A structure of memory device includes trench isolation lines in a substrate, extending along a first direction. An active region in the substrate is between adjacent two of the trench isolation lines. A dielectric layer is disposed on the active region of the substrate. A floating gate corresponding to a memory cell is disposed on the dielectric layer between adjacent two of the trench isolation lines. The floating gate has a first protruding structure at a sidewall extending along the first direction. A first insulating layer crosses over the floating gate and the trench isolation lines. A control gate line is disposed on the first insulating layer over the floating gate, extending along a second direction intersecting with the first direction. The control gate line has a second protruding structure correspondingly stacked over the first protruding structure of the floating gate.

19 Claims, 10 Drawing Sheets

(56) References Cited

U.S. PATENT DOCUMENTS

| | | | | |
|---|---|---|---|---|
| 7,554,149 B2* | 6/2009 | Kim | .................. | H01L 27/115 |
| | | | | 257/315 |
| 7,821,054 B2* | 10/2010 | Watanabe | ............. | H01L 27/115 |
| | | | | 257/315 |
| 8,575,676 B2* | 11/2013 | Nakao | ............... | H01L 21/76232 |
| | | | | 257/315 |
| 8,669,607 B1* | 3/2014 | Tsair | ................... | H01L 29/7881 |
| | | | | 257/316 |
| 9,076,878 B2* | 7/2015 | La Rosa | ............... | H01L 29/788 |
| | | | | 257/320 |
| 2005/0230741 A1* | 10/2005 | Tsunoda | ................ | H01L 27/105 |
| | | | | 257/315 |
| 2008/0093653 A1* | 4/2008 | Park | ..................... | H01L 27/115 |
| | | | | 257/316 |
| 2015/0056768 A1* | 2/2015 | Hsu | .................... | H01L 29/7881 |
| | | | | 438/266 |
| 2016/0013195 A1* | 1/2016 | Tsao | ................. | H01L 29/66825 |
| | | | | 257/316 |
| 2016/0133639 A1* | 5/2016 | Tran | .................... | H01L 29/7881 |
| | | | | 365/185.29 |
| 2016/0365350 A1* | 12/2016 | Chuang | ............ | H01L 21/32139 |

* cited by examiner

STRUCTURE OF MEMORY DEVICE HAVING FLOATING GATE WITH PROTRUDING STRUCTURE

CROSS-REFERENCE TO RELATED APPLICATION

This application claims the priority benefit of Chinese patent application serial no. 201910510488.5, filed on Jun. 13, 2019. The entirety of the above-mentioned patent application is hereby incorporated by reference herein and made a part of this specification.

BACKGROUND

1. Field of the Invention

The present invention generally relates to semiconductor fabrication, and particularly to a structure of a memory device and method for fabricating method thereof.

2. Description of Related Art

The non-volatile memory device is almost an absolutely required equipment in a digital electronic product. The digital electronic products such as computer system, mobile phone, camera, video apparatus, and so on, are also the necessary products in the daily life. Therefore, the non-volatile memory device is commonly required.

The non-volatile memory device in an example is a flash memory, including a control gate and a floating gate. Since the data stored in the flash memory are often changed according to the actual operation, the erasing operation of data is also often operated in addition to the reading operation and writing operation. In the storage operation for a large amount of data, the efficiency for erasing data would influence the whole performance of the memory device.

The cell structure of flash memory is still under development, so to expect the improvement of the whole performance of the memory device, in which the efficiency for erasing data would necessarily be considered and improved.

SUMMARY OF THE INVENTION

The invention provides a structure of memory device. For the structure of the memory device, both of the floating gate and the control gate line include a protruding part, so to produce more of the sharp corner and sharp edge, which is advantageous to quickly remove the electrons out from the floating gate. As a result, the erasing efficiency may be improved.

In an embodiment, the invention provides a structure of memory device. The structure of memory device includes a plurality of trench isolation lines in a substrate, extending along a first direction. An active region is in the substrate between adjacent two of the trench isolation lines. A dielectric layer is disposed on the active region of the substrate. A floating gate is disposed on the dielectric layer corresponding to a memory cell between adjacent two of the trench isolation lines. The floating gate comprises a first protruding structure extending along the first direction from a sidewall of the floating gate. A first insulating layer is crossing over the floating gate and the trench isolation lines. A control gate line is disposed on the first insulating layer over the floating gate, extending along a second direction intersecting with the first direction. The control gate line has a second protruding structure correspondingly stacked over the first protruding structure of the floating gate.

In an embodiment, as to the structure of memory device, it further comprises an erase gate line between adjacent two of the control gate line, wherein the first protruding structure and the second protruding structure are extending toward the erase gate line.

In an embodiment, as to the structure of memory device, it further comprises a second insulating layer on a sidewall of the control gate line to insulate from the erase gate line.

In an embodiment, as to the structure of memory device, the first insulating layer and the second insulating layer comprises an oxide/nitride/oxide structure.

In an embodiment, as to the structure of memory device, a portion of the dielectric layer between the erase gate line and the substrate comprises an oxide/nitride/oxide structure.

In an embodiment, as to the structure of memory device, the substrate comprises a doped line under the erase gate line to serve as a selection line.

In an embodiment, as to the structure of memory device, the first protruding structure and the second protruding structure comprise a single protruding bar, multiple protruding bars, single triangular protruding part, multiple triangular protruding parts, zigzag-like protruding part, or wave-like protruding part.

In an embodiment, as to the structure of memory device, the second protruding structure is conformal to but smaller than the first protruding structure.

In an embodiment, as to the structure of memory device, a width of the second protruding structure of the control gate line is not greater than a width of the active region.

In an embodiment, as to the structure of memory device, the active region of the substrate comprises a doped region.

In an embodiment, as to the structure of memory device, it further comprises a word line extending along the second direction, abutting to the floating gate and the control gate line at one side opposite to the first protruding structure and the second protruding structure.

In an embodiment, as to the structure of memory device, a top of the trench isolation lines is higher than a bottom of the floating gate.

In an embodiment, as to the structure of memory device, a portion of the dielectric layer between the floating gate and the substrate further comprises a vertical portion between the trench isolation lines and a lower part of the floating gate.

In an embodiment, as to the structure of memory device, the vertical portion of the dielectric layer comprises an oxide layer.

In an embodiment, as to the structure of memory device, the first protruding structure provides at least a sharp edge and a sharp corner at an end part of the first protruding structure.

In an embodiment, the invention provides a structure of memory device. The structure of memory device comprises a plurality of trench isolation lines in a substrate, extending along a first direction. An active region is in the substrate between adjacent two of the trench isolation lines. A floating gate is disposed over the substrate between adjacent two of the trench isolation lines, wherein the floating gate has a first protruding structure extending out along the first direction from a sidewall of the floating gate. A control gate line is disposed over the floating gate, extending along a second direction intersecting with the first direction. The control gate line has a second protruding structure correspondingly stacked over the first protruding structure of the floating gate. An insulating structure layer is to isolate the floating gate from the control gate line.

In an embodiment, as to the structure of memory device, the first protruding structure and the second protruding structure comprise a single protruding bar, multiple protruding bars, single triangular protruding part, multiple triangular protruding parts, zigzag-like protruding part, or wave-like protruding part.

In an embodiment, as to the structure of memory device, the second protruding structure is conformal to but smaller than the first protruding structure.

In an embodiment, as to the structure of memory device, a width of the second protruding structure of the control gate line is not greater than a width of the active region.

In an embodiment, as to the structure of memory device, a top of the trench isolation lines is higher than a bottom of the floating gate.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The invention is directed to a structure of memory device. According to an embodiment of the invention, in the structure of memory device as provided in the invention, both of the floating gate and the control gate line in the memory cell have protruding structures in similar shape, so to produce more of sharp corners and sharp edges. This structure is advantageous to quickly remove the electrons out from the floating gate during the erasing operation, at least the erasing efficiency may be improved.

Multiple embodiments are provided for describing the invention but the invention is not just limited to the embodiments as provided. In addition, a proper combination between the embodiments may also be made.

The invention has looked into the structure of memory device, so to modify the structure of memory device as intended, then the operation efficiency of the memory device may be improved.

Figure 1:
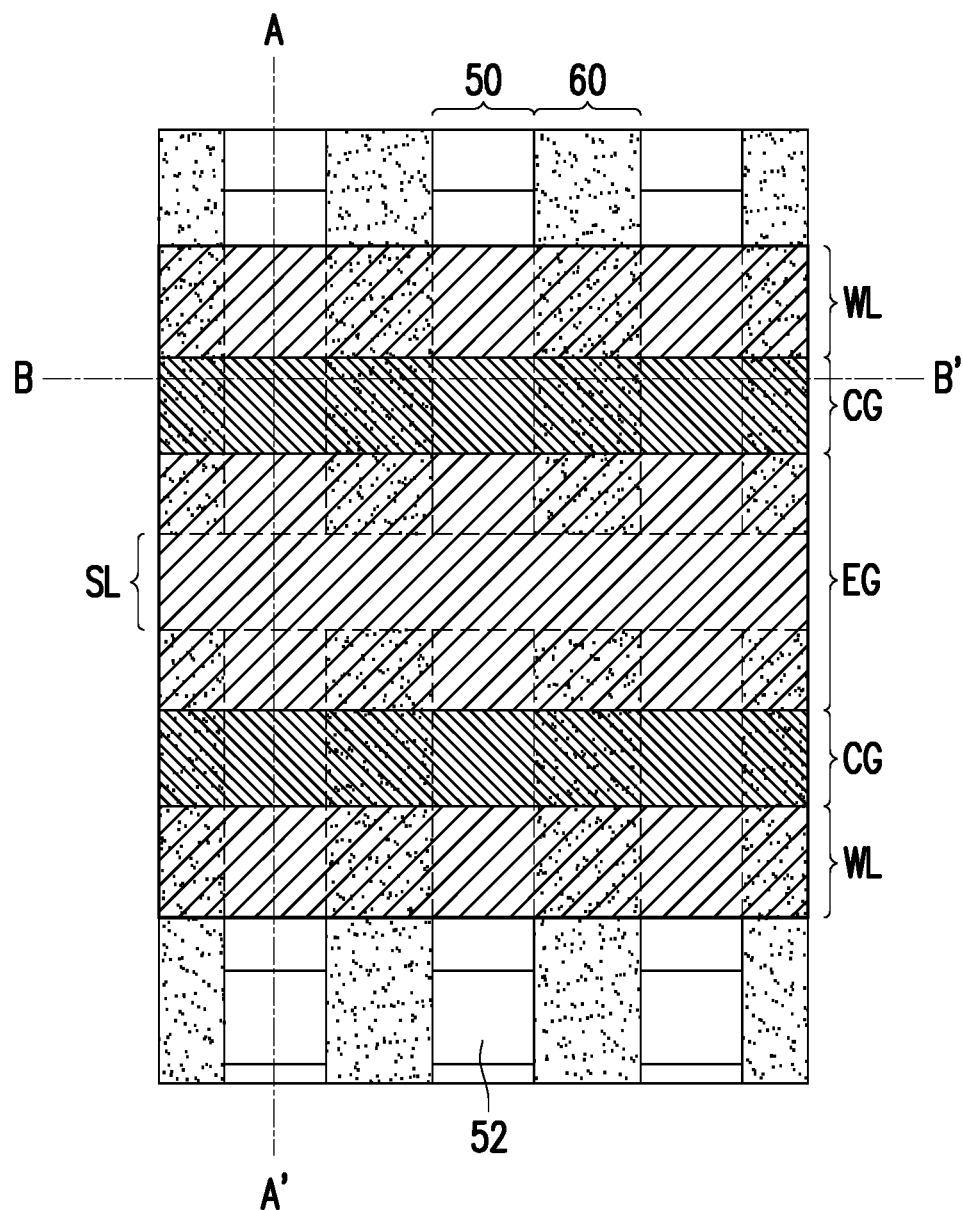
FIG. 1 is a drawing, schematically illustrating a layout of the memory device, according to an embodiment of the invention.
Figure 2:
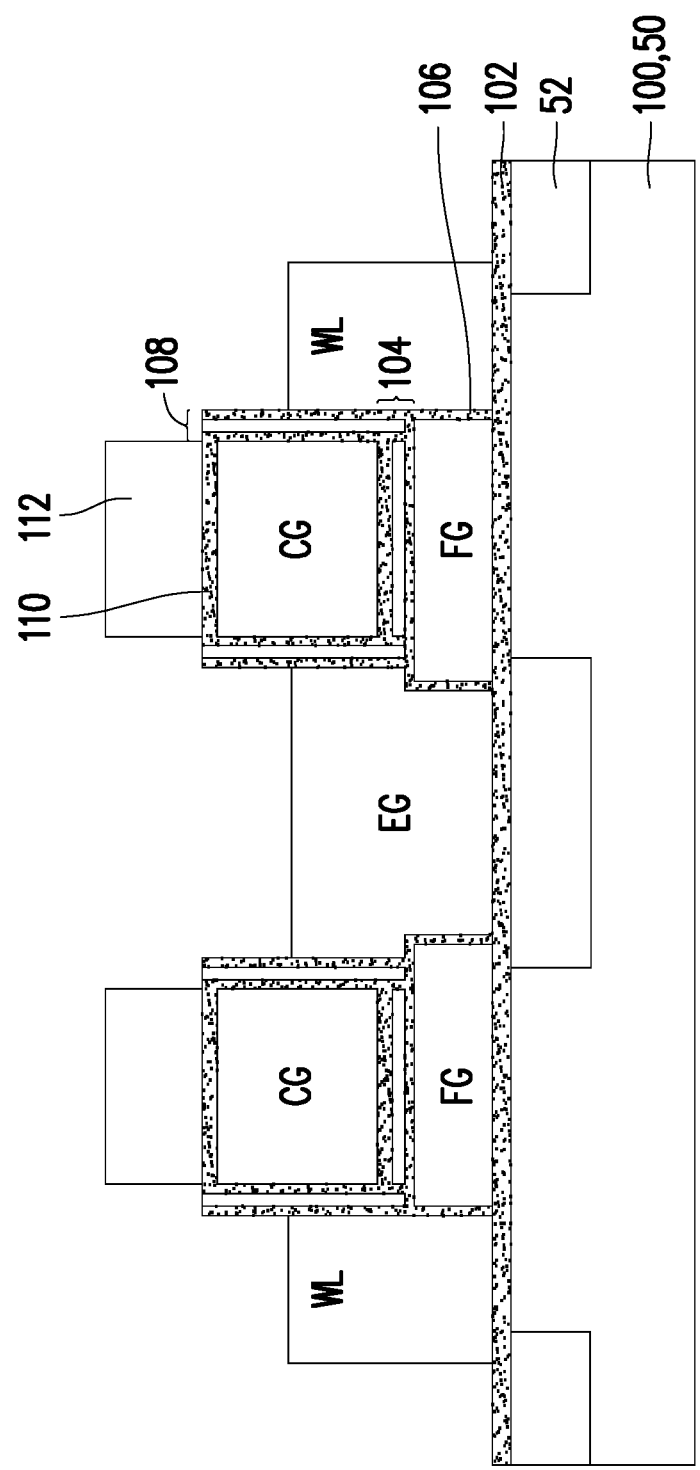
FIG. 2 is a drawing, schematically illustrating a cross-sectional structure of the memory device along a cutting line A-A' in FIG. 1, according to an embodiment of the invention.
Figure 3:
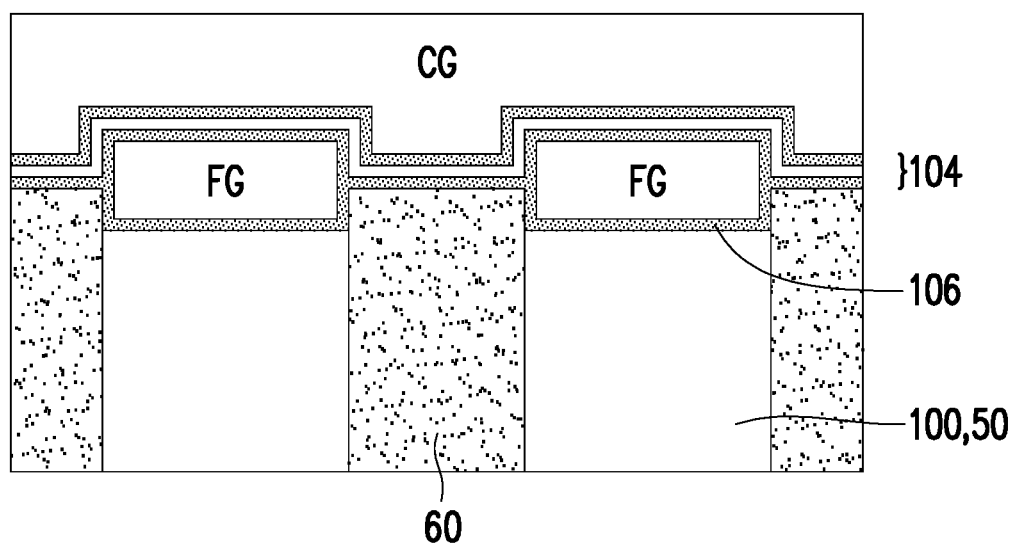
FIG. 3 is a drawing, schematically illustrating a cross-sectional structure of the memory device along a cutting line B-B' in FIG. 1, according to an embodiment of the invention.

FIG. 1 is a drawing, schematically illustrating a layout of the memory device, according to an embodiment of the invention. FIG. 2 is a drawing, schematically illustrating a cross-sectional structure of the memory device along a cutting line A-A' in FIG. 1, according to an embodiment of the invention. FIG. 3 is a drawing, schematically illustrating a cross-sectional structure of the memory device along a cutting line B-B' in FIG. 1, according to an embodiment of the invention.

Referring to FIG. 1 to FIG. 3 together, the structure of memory device in an example is a flash memory. A number of memory cells of the memory device in an array manner are formed on the substrate 100. The substrate 100 is configured into multiple trench isolation lines 60 in the substrate 100, extending along a first direction. The first direction in an example is the direction of the cutting line A-A'. Multiple active regions 50 are in the substrate and between adjacent two trench isolation lines 60. The active regions 50 may be in a form of active lines. The dielectric layer 102 is at least disposed on the active region 50. The active regions 50 of the substrate 100 may have a doped region 52.

As to the operation mechanism to the memory cell, the memory cell includes a floating gate FG, disposed on the dielectric layer 102, located between adjacent two of the trench isolation lines 60. A portion of the dielectric layer 102 between the floating gate FG and the substrate 100 is serving as a gate insulating layer. The floating gate FG is implemented corresponding to each memory cell. In addition, the control gate line CG of the memory cell is extending along the second direction, connecting a string of memory cells. The second direction in an example is the direction of the cutting line B-B', intersecting with the first direction, such as perpendicular intersection. The control gate line CG is over the floating gate FG, and is isolated by the insulating layer 104. The insulating layer 104 in an embodiment is oxide/nitride/oxide (ONO) structure. The erase gate line EG is on the substrate 100, located between the floating gates FG and also between adjacent two control gate lines CG. The isolation between the erase gate line EG and the substrate 100 is provided from a portion of the dielectric layer 102. The substrate 100 has the doped region 52 under the erase gate line EG to server as the selection line SL as needed in actual operation. The outer side of the floating gate FG and the control gate line has the word lines WL. A dielectric layer 106 is between the word line WL and the floating gate FG to isolate each other. Further, an insulating layer 108 is also between the word line WL and the erase gate line EG. In an example, it may also be the ONO structure. A dielectric layer 110 and a mask layer 112 may also be disposed on top of the control gate line CG, so to further protect the control gate line CG.

Here, the insulation between the floating gate FG, the control gate line CG, the erase gate line EG, word line WL, and the substrate 100 is done by the dielectric material. Each portion of the dielectric material may be formed according to the actual need. The invention is not necessary to be limited to a specific structure.

In addition, as viewed from FIG. 3, the dielectric layer 206 is to isolate between the floating gate FG and the substrate 100 but a top of the trench isolation line 60 in an example is lower than a bottom of the floating gate FG. The floating gate FG and the control gate line CG are isolated therebetween by the insulating layer 104.

In considering the foregoing structure of memory device, the charges as stored in the floating gate FG during the erasing operation would be removed out by the erasing gate line EG. As having been observed in the invention, a capacitor path is formed between the floating gate FG and the erase gate line EG through the dielectric layer 106. As a result, the charges during the erasing operation are removed out from the floating gate FG. It is similar in circuit effect that the charges are driven out from a capacitor. Further, the invention has looked into in detail about the mechanism to remove the charges out. An electric field with a strength as produced by the operation voltage is applied to the charges, so to produce the driving force on the charges, in which a tip discharge phenomenon may more easily cause the charges to leave out from the structure body.

After looking into the mechanism in the invention, the invention has proposed a structure for the control gate line CG and the floating gate FG, so to improve the efficiency to remove the charges out from the floating gate FG. FIG. 4A to FIG. 4D are drawings, schematically illustrating the structures of the control gate line of the memory device in top view, according to an embodiment of the invention.

Figure 4A:
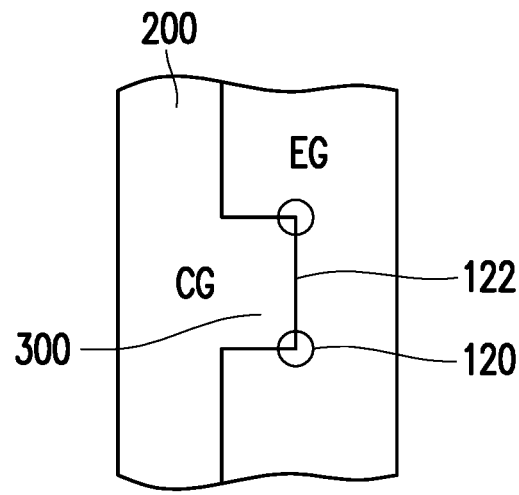
FIG. 4A to FIG. 4D are drawings, schematically illustrating the structures of the control gate line of the memory device in top view, according to an embodiment of the invention.

Referring to FIG. 4A, taking a memory cell corresponding to a control gate line 200 as an example, the protruding structure 300 may be added. The protruding structure 300 is protruding toward the erase gate line EG. Here, the erase gate line EG is just schematically illustrating the implementation relation between the control gate line CG and the floating gate FG, which is under the control gate line CG. The dielectric layer as actually needed between the control gate line CG and the floating gate FG in FIG. 4A is omitted without descriptions in detail. The protruding structure 300 of the control gate line 200, in an example, is a single protruding bar, which may additionally produce the number of the sharp corner 120 and the sharp edge 122 and then thereby improve the efficiency to remove the charges from the floating gate FG, which is under the control gate line CG.

Figure 4B:
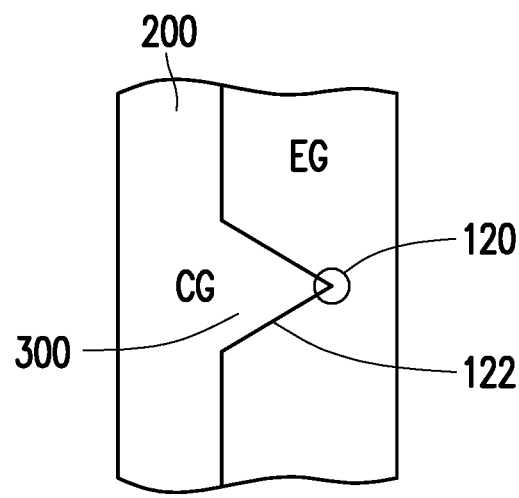

With the aspect of the protruding structure 300, the geometric shape may have various options. Referring to FIG. 4B, the protruding structure 300 may be a single triangular protruding part, which may also additionally provide the sharp corner 120 and the sharp edge 122.

Figure 4C:
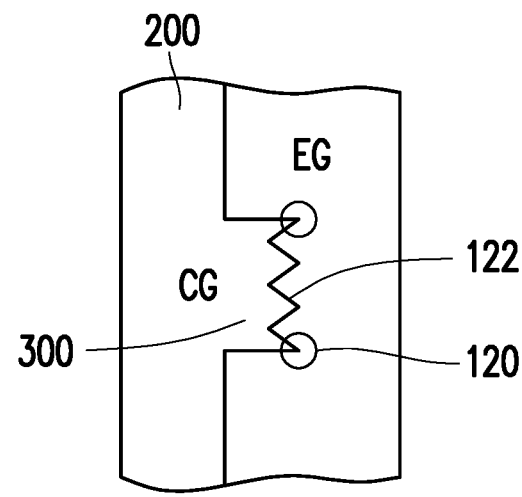
Figure 4D:
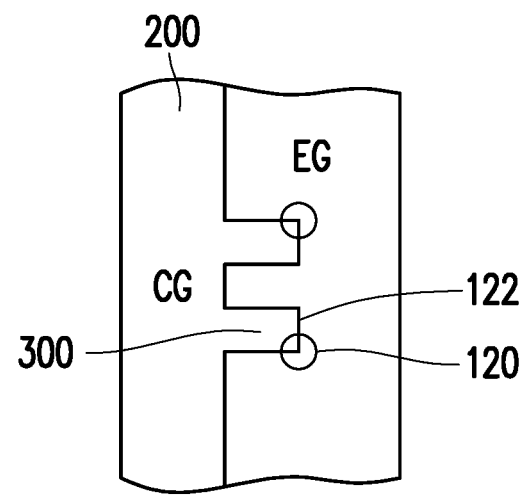

Further referring to FIG. 4C, according to the protruding structure 300 in FIG. 4B, the protruding structure 300 may be multiple triangular protruding parts, which may even further be realized as zigzag-like protruding part or wave-like protruding part. Referring to FIG. 4D, according to the protruding structure 300 in FIG. 4A, the protruding structure 300 may be multiple protruding bars.

The protruding structure 300 in actual design may also be a combination from the manners in FIG. 4A to FIG. 4D, so to have the protruding structure 300 as intended, so to provide more of the sharp corner 120 and the sharp edge 122.

Figure 5:
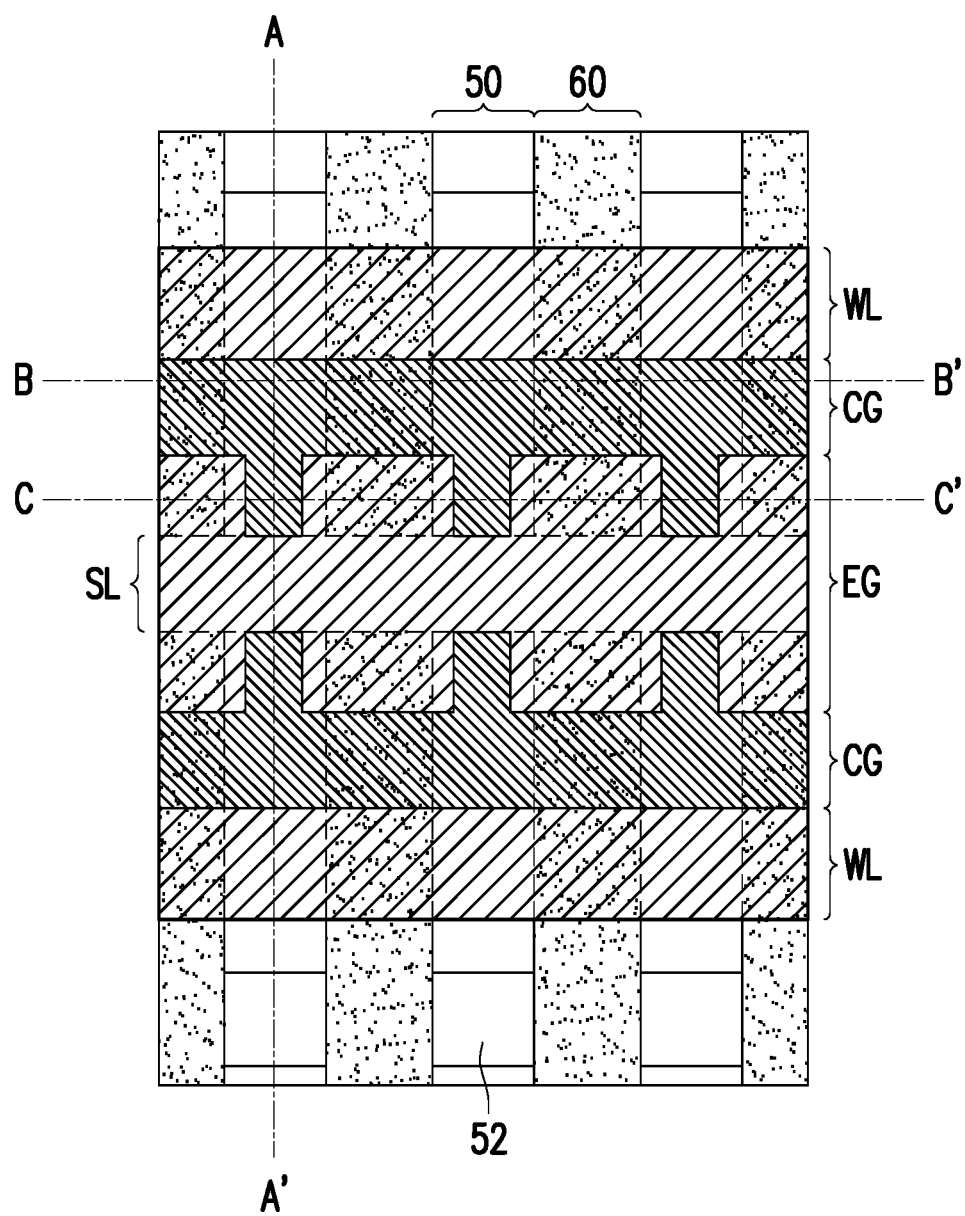
FIG. 5 is a drawing, schematically illustrating a layout of the memory device, according to an embodiment of the invention.

FIG. 5 is a drawing, schematically illustrating a layout of the memory device, according to an embodiment of the invention. Referring to FIG. 5, the control gate line CG of the invention corresponding to the memory cell in design has been added with the protruding structure 300, in which the control gate line CG includes the protruding structure 300 in comparison to the layout in FIG. 1. The protruding structure 300 extends out from the sidewall to the erase gate line EG, along the direction of the cutting line A-A'.

Figure 6:
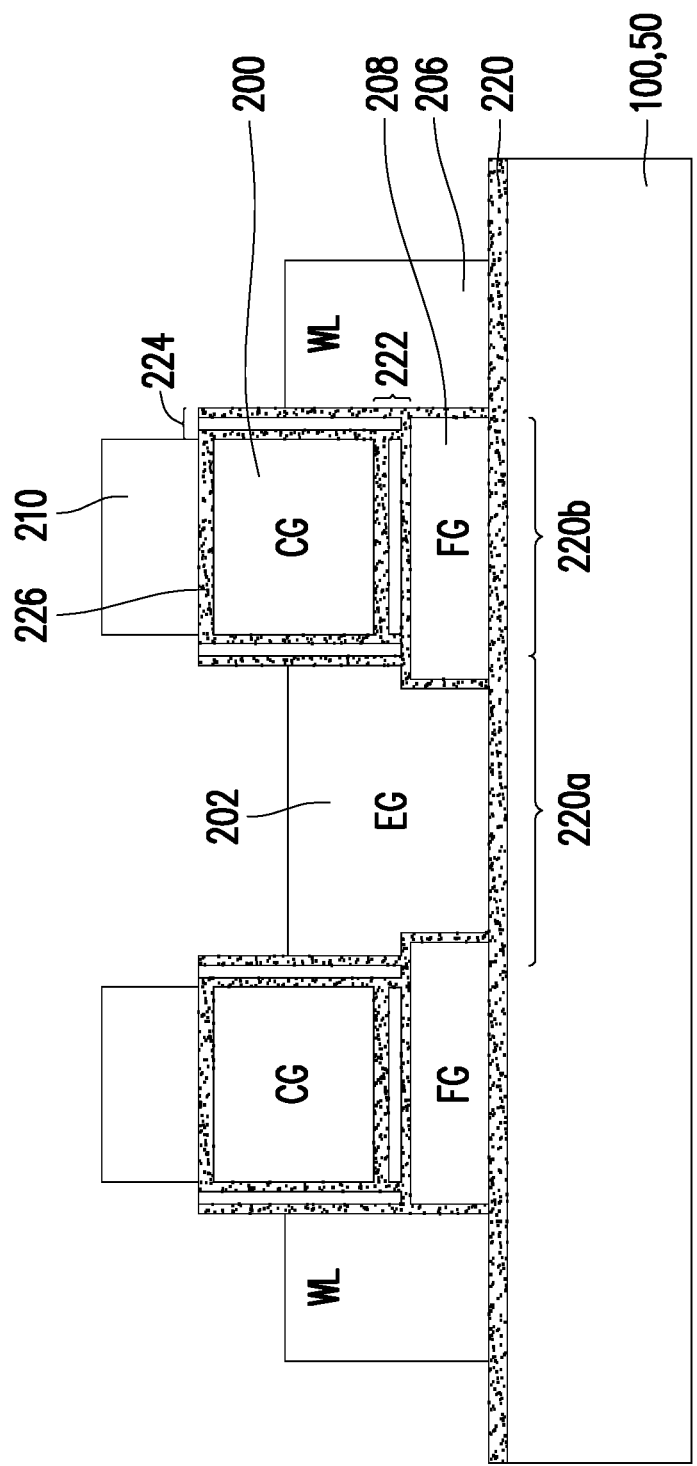
FIG. 6 is a drawing, schematically illustrating a cross-sectional structure of the memory device along a cutting line A-A' in FIG. 5, according to an embodiment of the invention.
Figure 7:
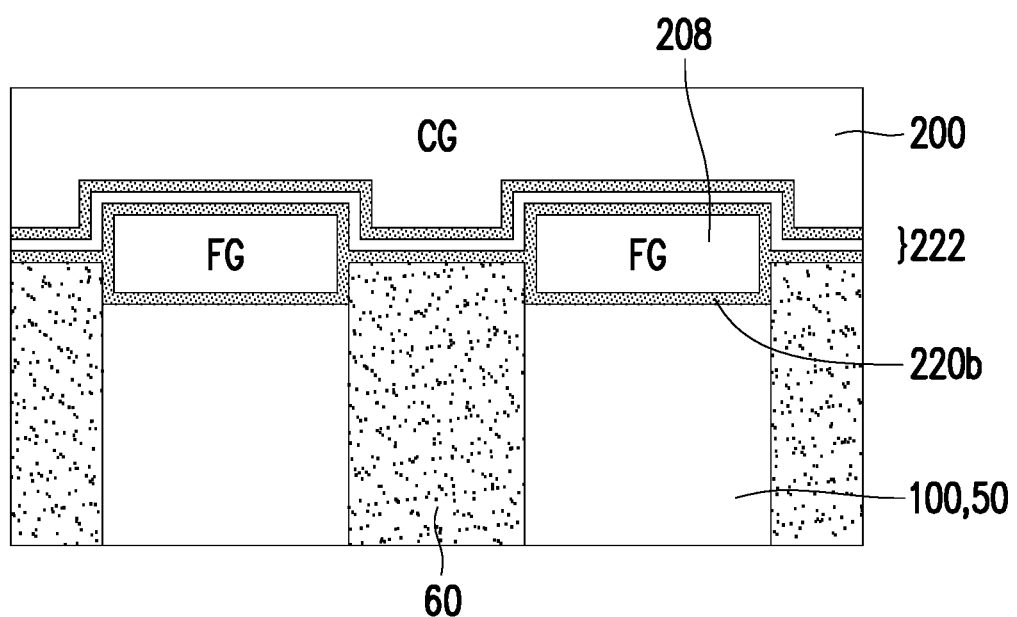
FIG. 7 is a drawing, schematically illustrating a cross-sectional structure of the memory device along a cutting line B-B' in FIG. 5, according to an embodiment of the invention.
Figure 8:
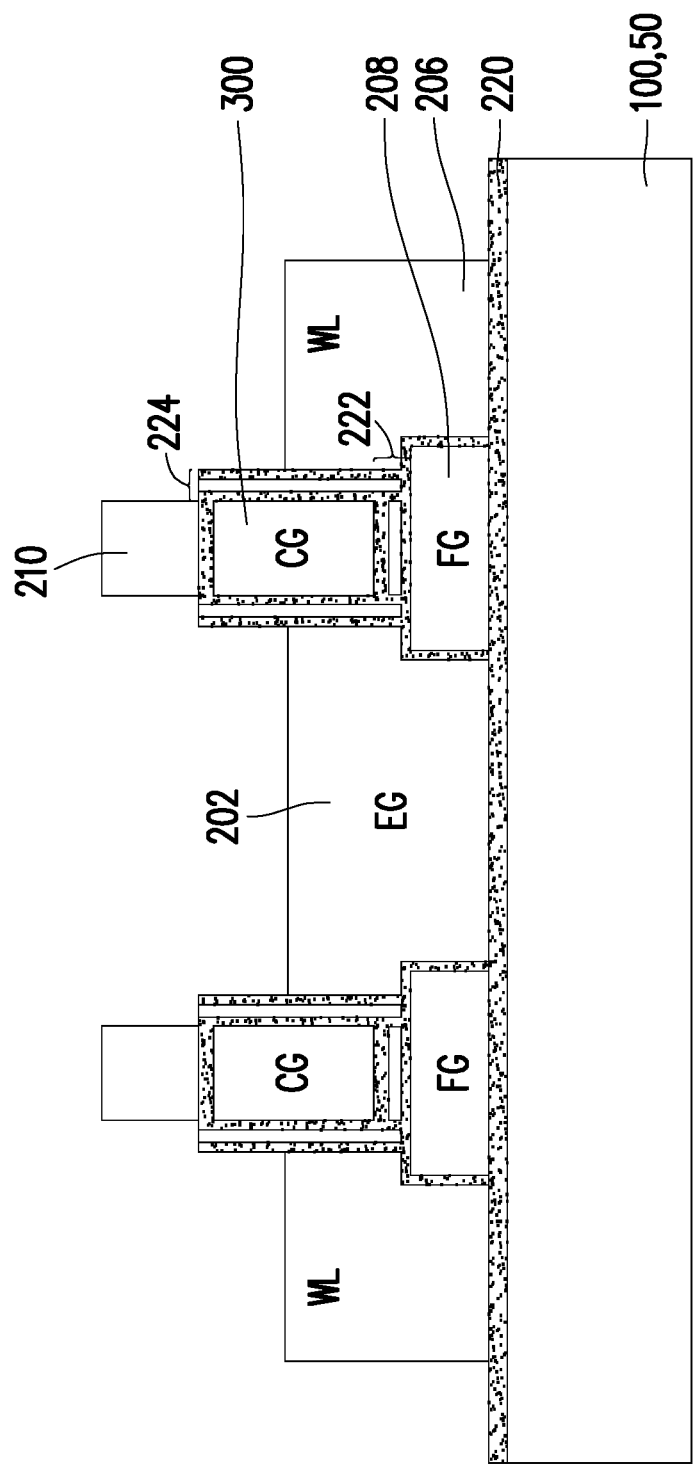
FIG. 8 is a drawing, schematically illustrating a cross-sectional structure of the memory device along a cutting line C-C' in FIG. 5, according to an embodiment of the invention.

As viewed from the cross-sectional structure, FIG. 6 is a drawing, schematically illustrating a cross-sectional structure of the memory device along a cutting line A-A' in FIG. 5, according to an embodiment of the invention. FIG. 7 is a drawing, schematically illustrating a cross-sectional structure of the memory device along a cutting line B-B' in FIG. 5, according to an embodiment of the invention. FIG. 8 is a drawing, schematically illustrating a cross-sectional structure of the memory device along a cutting line C-C' in FIG. 5, according to an embodiment of the invention.

Referring to FIG. 6, the cross-section structure at the cutting line A-A' is similar to the structure in FIG. 2. The substrate 100 at least has dielectric layer 220 thereon on active region 50, to have the insulation between various gate lines and the substrate 100. The memory cell includes the floating gate FG 208, dispose don the dielectric layer 220. The active region 50 is disposed between adjacent two trench lines 600. A dielectric portion 220b of the dielectric layer 220 between the floating gate FG 208 and the substrate 100 serves as the gate insulating layer. The floating gate FG 208 is implemented corresponding to each memory cell. In addition, the control gate line CG of the memory cell is extending along the second direction to connect a string of memory cells. The second direction in an example is the direction of the cutting line B-B', intersecting with the first direction, such as perpendicular intersection. The control gate line CG 200 is above the floating gate FG 208, and isolated by the insulating layer 222. The insulating layer 222 in an example is the ONO structure. The erase gate line EG 202 is over the substrate 100, disposed between the floating gates 208 and also between adjacent two control gate lines 200.

The erase gate line EG 202 in the embodiment is shared by two memory cells, as an example, so that it is between adjacent two control gate lines CG 200. A dielectric portion 220a of the dielectric layer 220 is for isolation between the erase gate line EG 202 and the substrate 100. The dielectric portion 220a in an example is a single oxide layer or the ONO structure without being specifically limited.

Here, the doped region in the substrate 100 has been omitted without further descriptions. The outer side of the floating gate FG 208 and the control gat e line 200 has the word line WL 206. The dielectric layer 220 is also disposed between the word line WL 206 and the floating gate FG 208 to isolate to each other. In addition, the dielectric layer 224 is also disposed between the word line WL 206 and the control gate line CG 200 to isolate to each other. The insulating layer 224 in vertical direction is on the sidewall of the control gate line CG 200 and may be the ONO structure in an example. The top of the control gate line CG 200 may also have the dielectric layer 226 and the mask layer 210 to further protect the control gate line CG 200.

The insulation between the floating gate FG 208, the control gate line CG 200, the erase gate line EG 202, the word line WL 206 and the substrate 100 may be accomplished by dielectric material. The structure of individual portion of the dielectric material may be formed according to actual design. The invention is not limited to a specific structure.

Referring to FIG. 7, the floating gate FG 206 is isolated from the substrate therebetween by the dielectric portion 220b but the top of the trench isolation line 600 is higher than the bottom of the floating gate FG 208. The floating gate FG 208 and the control gate line CG 200 is isolated by the insulating layer 222 therebetween.

Referring to FIG. 8, it is cross-sectional structure on the cutting line C-C', in which the protruding structure 300 as proposed in the invention with respect to the control gate line CG 200 may be observed. The floating gate FG 208 under the control gate line CG 200, based on the fabrication flow, has the protruding structure 208a, which would be further described in FIG. 9.

The size of the protruding structure 300 for example is less than a width of the active region. In an embodiment, the erase gate line EG 202 is shared by two memory cells. As such, the protruding structures 300 of two control gate line CG 200 are facing to each other but separate by a proper distance without contacting to each other.

Figure 9:
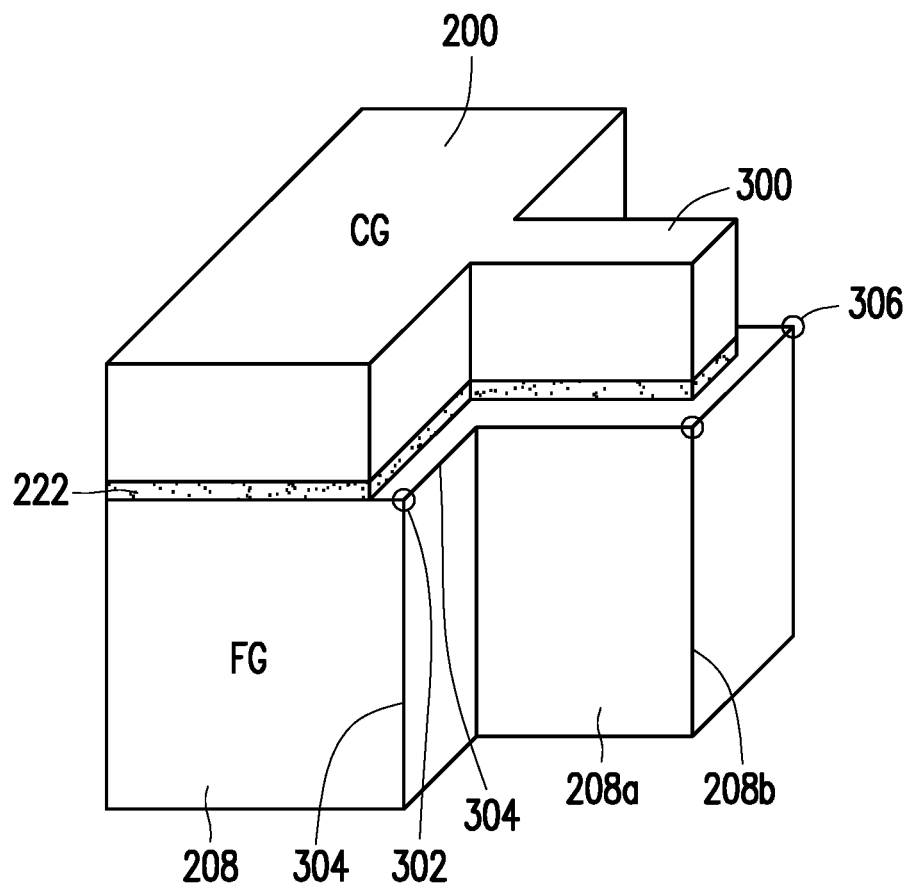
FIG. 9 is a drawing, schematically illustrating a perspective structure of the control gate line with the floating gate of the memory device, according to an embodiment of the invention.

FIG. 9 is a drawing, schematically illustrating a perspective structure of the control gate line with the floating gate of the memory device, according to an embodiment of the invention. Referring to FIG. 9, as to the arrangement in fabrication flow, when the control gate line CG 200 with the protruding structure is formed, the floating gate FG 208 under the control gate line CG 200 may be also etched, so that the protruding structure 208a of the floating gate FG 208 may also be formed. The protruding structure 208a of the floating gate FG 208 and the protruding structure 300 of the control gate line CG 200 are similar in shape. In an embodiment, the size of the protruding structure 300 with respect to the protruding structure 208a may be shrink by a little but the invention is not limited to this manner.

The floating gate FG 208 of the invention may obtain the protruding structure 208a in accordance with the protruding structure 300 of the control gate line CG 200. Except the original sharp corner 304 and the sharp edge 302 of the floating gate FG 208, the protruding structure 208a further provides the sharp corner 306 and the sharp edge 208b, so to improve the discharging effect.

As to the foregoing the descriptions of multiple embodiments, in the structure of the memory device provided by the invention, the floating gate and the control gate line of the memory cell have the similar protruding structures extending toward the erase gate line. The protruding structure of the floating gate, associating with the control of the control gate line, provides more of sharp corners and sharp edges. This, the structure is advantageous to quickly remove the charges as stored in the floating gate during the erasing operation. The erasing efficiency may at least be improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A structure of memory device, comprising:
a plurality of trench isolation lines in a substrate, extending along a first direction;
an active region in the substrate between adjacent two of the trench isolation lines;
a dielectric layer on the active region of the substrate;
a floating gate, in a top-view perspective over the substrate, disposed on the dielectric layer corresponding to a memory cell between adjacent two of the trench isolation lines, wherein the floating gate comprises a first protruding structure extending along the first direction from a sidewall of the floating gate;
a first insulating layer, in the top-view perspective, crossing over the floating gate and the trench isolation lines;
a control gate line, in the top-view perspective, disposed on the first insulating layer over the floating gate, extending along a second direction intersecting with the first direction, wherein the control gate line has a second protruding structure correspondingly stacked over the first protruding structure of the floating gate; and
an erase gate line between adjacent two of the control gate lines, wherein the first protruding structure and the second protruding structure are extending into the erase gate line.

2. The structure of memory device of claim 1, further comprising a second insulating layer on a sidewall of the control gate line to insulate from the erase gate line.

3. The structure of memory device of claim 2, wherein the first insulating layer and the second insulating layer comprises an oxide/nitride/oxide structure.

4. The structure of memory device of claim 1, wherein a portion of the dielectric layer between the erase gate line and the substrate comprises an oxide/nitride/oxide structure.

5. The structure of memory device of claim 1, wherein the substrate comprises a doped line under the erase gate line to serve as a selection line.

6. The structure of memory device of claim 1, wherein the first protruding structure and the second protruding structure comprise a single protruding bar, multiple protruding bars, single triangular protruding part, multiple triangular protruding parts, zigzag-like protruding part, or wave-like protruding part.

7. The structure of memory device of claim 1, wherein the second protruding structure is conformal to but smaller than the first protruding structure.

8. The structure of memory device of claim 1, wherein a width of the second protruding structure of the control gate line is not greater than a width of the active region.

9. The structure of memory device of claim 1, wherein the active region of the substrate comprises a doped region.

10. The structure of memory device of claim 1, further comprising a word line extending along the second direction, abutting to the floating gate and the control gate line at one side opposite to the first protruding structure and the second protruding structure.

11. The structure of memory device of claim 1, wherein a top of the trench isolation lines is higher than a bottom of the floating gate.

12. The structure of memory device of claim 11, wherein a portion of the dielectric layer between the floating gate and the substrate further comprises a vertical portion between the trench isolation lines and a lower part of the floating gate.

13. The structure of memory device of claim 12, wherein the vertical portion of the dielectric layer comprises an oxide layer.

14. The structure of memory device of claim 1, wherein the first protruding structure provides at least a sharp edge and a sharp corner at an end part of the first protruding structure.

15. A structure of memory device, comprising:
a plurality of trench isolation lines in a substrate, extending along a first direction;
an active region in the substrate, between adjacent two of the trench isolation lines;
a floating gate, in a top-view perspective over the substrate, disposed over the substrate between adjacent two of the trench isolation lines, wherein the floating gate has a first protruding structure extending out along the first direction from a sidewall of the floating gate;

a control gate line, in the top-view perspective, disposed over the floating gate, extending along a second direction intersecting with the first direction, wherein the control gate line has a second protruding structure correspondingly stacked over the first protruding structure of the floating gate;

an insulating structure layer, in the top-view perspective, to isolate the floating gate from the control gate line; and an erase gate line between adjacent two of the control gate lines, wherein the first protruding structure and the second protruding structure are extending into the erase gate line.

16. The structure of memory device of claim 15, wherein the first protruding structure and the second protruding structure comprise a single protruding bar, multiple protruding bars, single triangular protruding part, multiple triangular protruding parts, zigzag-like protruding part, or wave-like protruding part.

17. The structure of memory device of claim 15, wherein the second protruding structure is conformal to but smaller than the first protruding structure.

18. The structure of memory device of claim 15, wherein a width of the second protruding structure of the control gate line is not greater than a width of the active region.

19. The structure of memory device of claim 15, wherein a top of the trench isolation lines is higher than a bottom of the floating gate.

* * * * *